United States Patent [19]

Jimbo et al.

[11] Patent Number: 5,756,402
[45] Date of Patent: May 26, 1998

[54] METHOD OF ETCHING SILICON NITRIDE FILM

[75] Inventors: Sadayuki Jimbo, Wappingers Falls; Tokuhisa Ohiwa, Fishkill, both of N.Y.; Haruki Mori, Yokosuka, Japan; Akira Kobayashi; Tadashi Shinmura, both of Yokohama, Japan; Yasuyuki Taniguchi, Tokyo, Japan

[73] Assignee: Kabushiki Kaisha Toshiba, Kawasaki, Japan

[21] Appl. No.: 426,693

[22] Filed: Apr. 24, 1995

Related U.S. Application Data

[63] Continuation-in-part of Ser. No. 397,036, Mar. 1, 1995, abandoned, which is a continuation of Ser. No. 172,812, Dec. 27, 1993, abandoned.

[30] Foreign Application Priority Data

Dec. 28, 1992 [JP] Japan ..................... 4-349325

[51] Int. Cl.$^6$ .......................................... H01L 21/302
[52] U.S. Cl. .......................... 438/724; 438/744; 438/723; 438/743; 438/740
[58] Field of Search .................. 156/643.1, 646.1, 156/662.1, 657.1; 438/710, 724, 738, 740, 744, 723, 743

[56] References Cited

U.S. PATENT DOCUMENTS

| | | | |
|---|---|---|---|
| 4,283,249 | 8/1981 | Ephrath | 156/643.1 |
| 4,484,979 | 11/1984 | Stocker | 156/643.1 |
| 4,678,539 | 7/1987 | Tomita et al. | 156/643.1 |
| 5,188,704 | 2/1993 | Babie et al. | 156/643.1 |
| 5,201,994 | 4/1993 | Nonaka et al. | 156/643.1 |
| 5,356,515 | 10/1994 | Tahara et al. | 156/643.1 |
| 5,431,788 | 7/1995 | Dahm et al. | 156/643.1 |

FOREIGN PATENT DOCUMENTS

| | | |
|---|---|---|
| 56111229 | 10/1990 | Japan . |
| 03293726 | 12/1991 | Japan . |

*Primary Examiner*—R. Bruce Breneman
*Assistant Examiner*—George Goudreau
*Attorney, Agent, or Firm*—Oblon, Spivak, McClelland, Maier & Neustadt, P.C.

[57] ABSTRACT

A method for etching a silicon nitride film, includes the steps of supplying a fluorine radical, a compound of fluorine and hydrogen, and an oxygen radical close to a substrate having the silicon nitride film, and selectively etching the silicon nitride film from the substrate with the fluorine radical, the compound of fluorine and hydrogen, and the oxygen radical. A method for etching a silicon nitride film, includes the steps of exciting gas containing fluorine and oxygen gas, thereby generating a fluorine radical and an oxygen radical, supplying the fluorine radical and the oxygen radical close to a substrate having the silicon nitride film and supplying gas of a compound containing a hydroxyl close to the substrate, reacting the fluorine radical, the oxygen radical and the compound containing the hydroxyl, thereby generating a compound of the fluorine radical, the oxygen radical and a compound of fluorine and hydrogen, and selectively etching the silicon nitride film from the substrate with the compound of the fluorine radical, the oxygen radical and the compound of fluorine and hydrogen.

18 Claims, 13 Drawing Sheets

$CF_4/O_2 = 360/100 (SCCM)$
$H_2O = 1000 (SCCM)$
PRESSURE 0.3 Torr

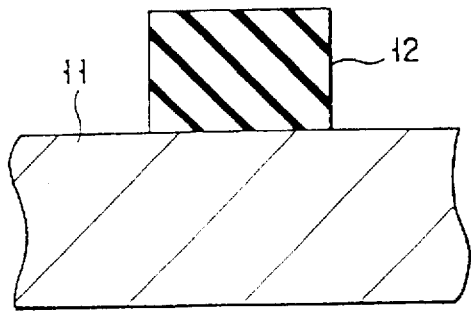
F I G. 1A
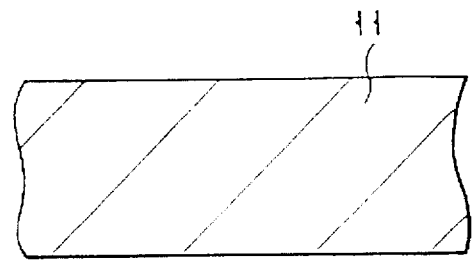
F I G. 1B
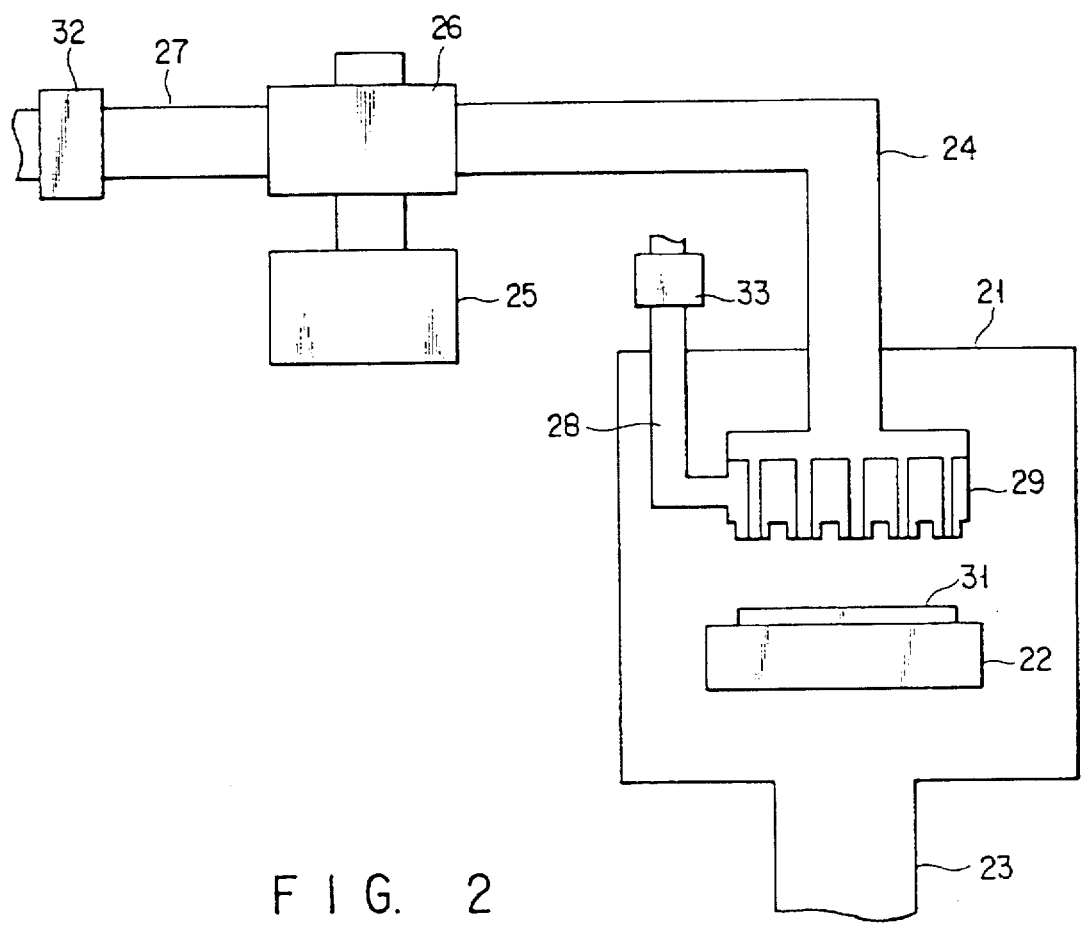
F I G. 2

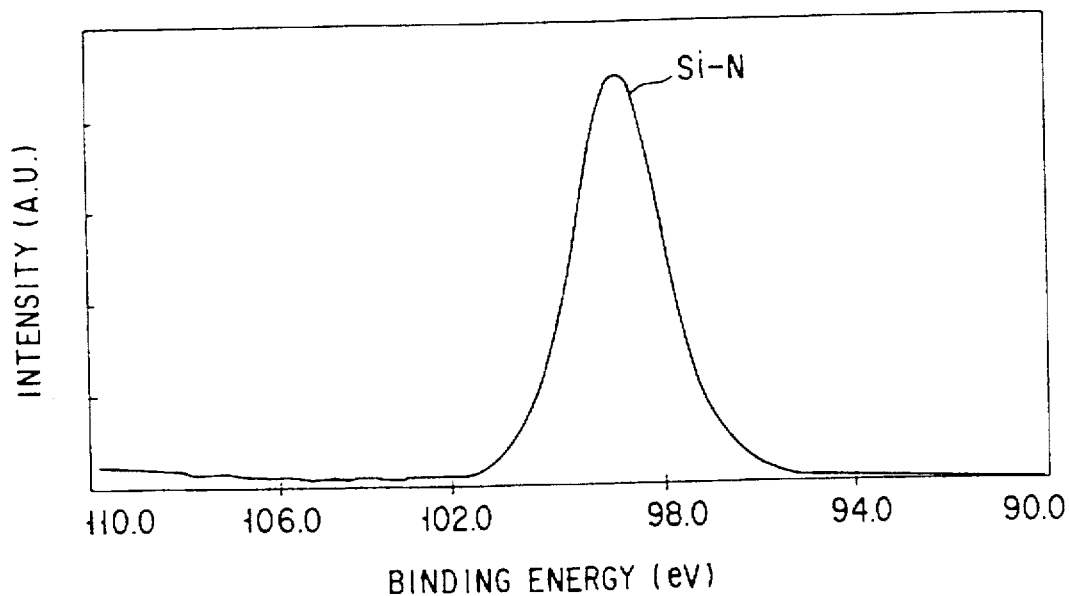
F I G. 4A
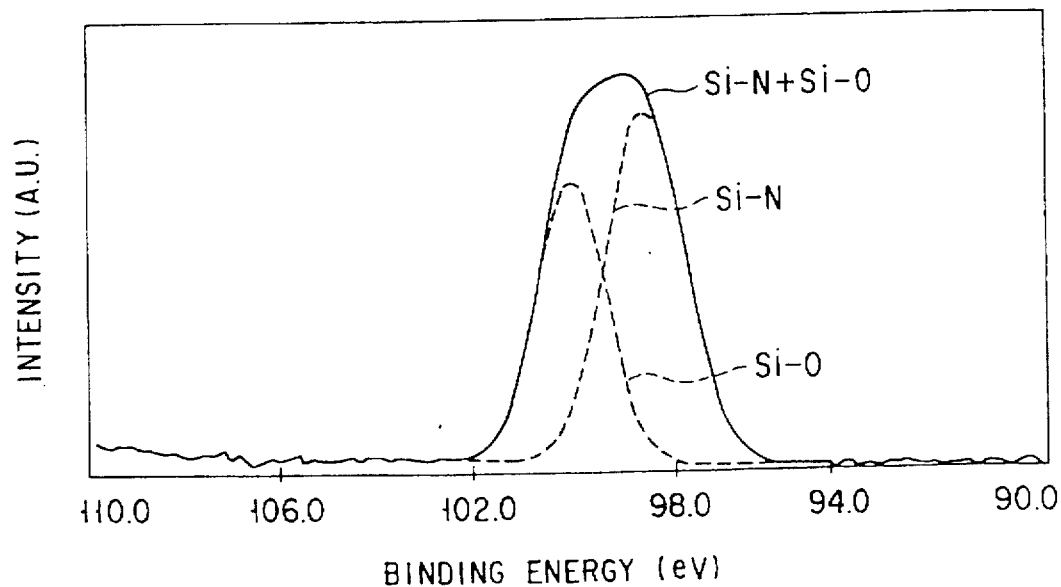
F I G. 4B

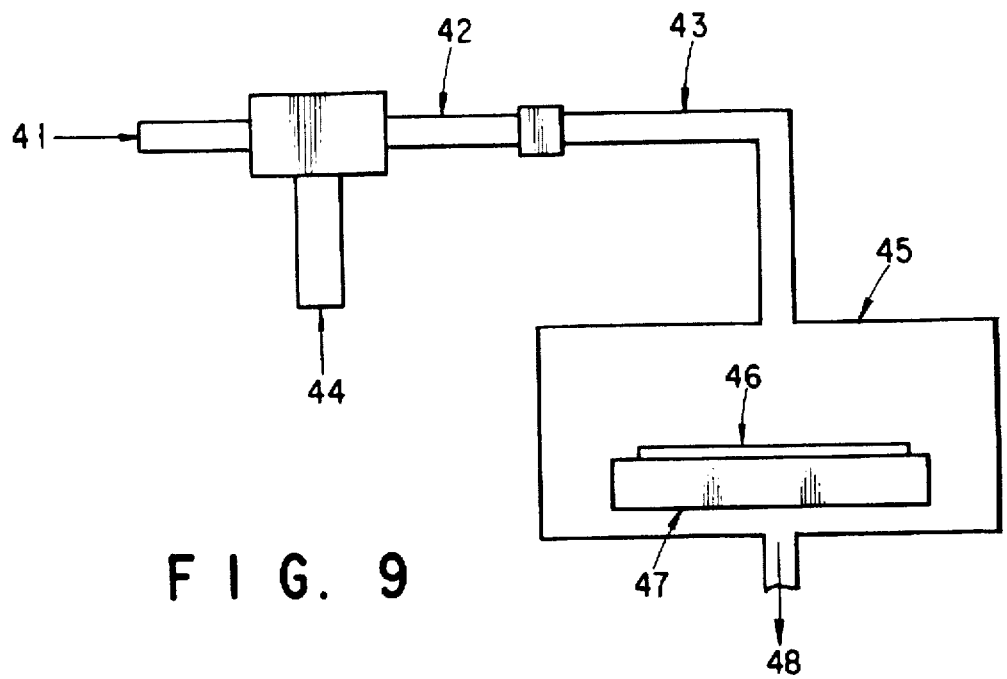
F I G. 9
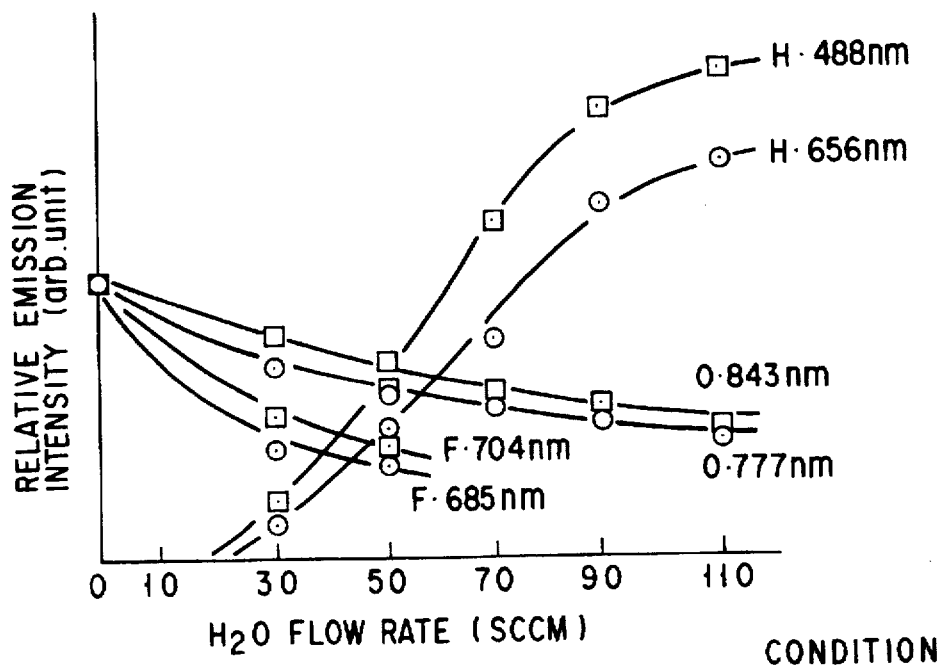
CONDITION
CF4 / O2 / H2O
TOTAL FLOW=590SCCM
CF4 : O2 = 1 : 1
PRES. = 70 Pa
POWER = 700W
TEMP. = 25°C
F I G. 11

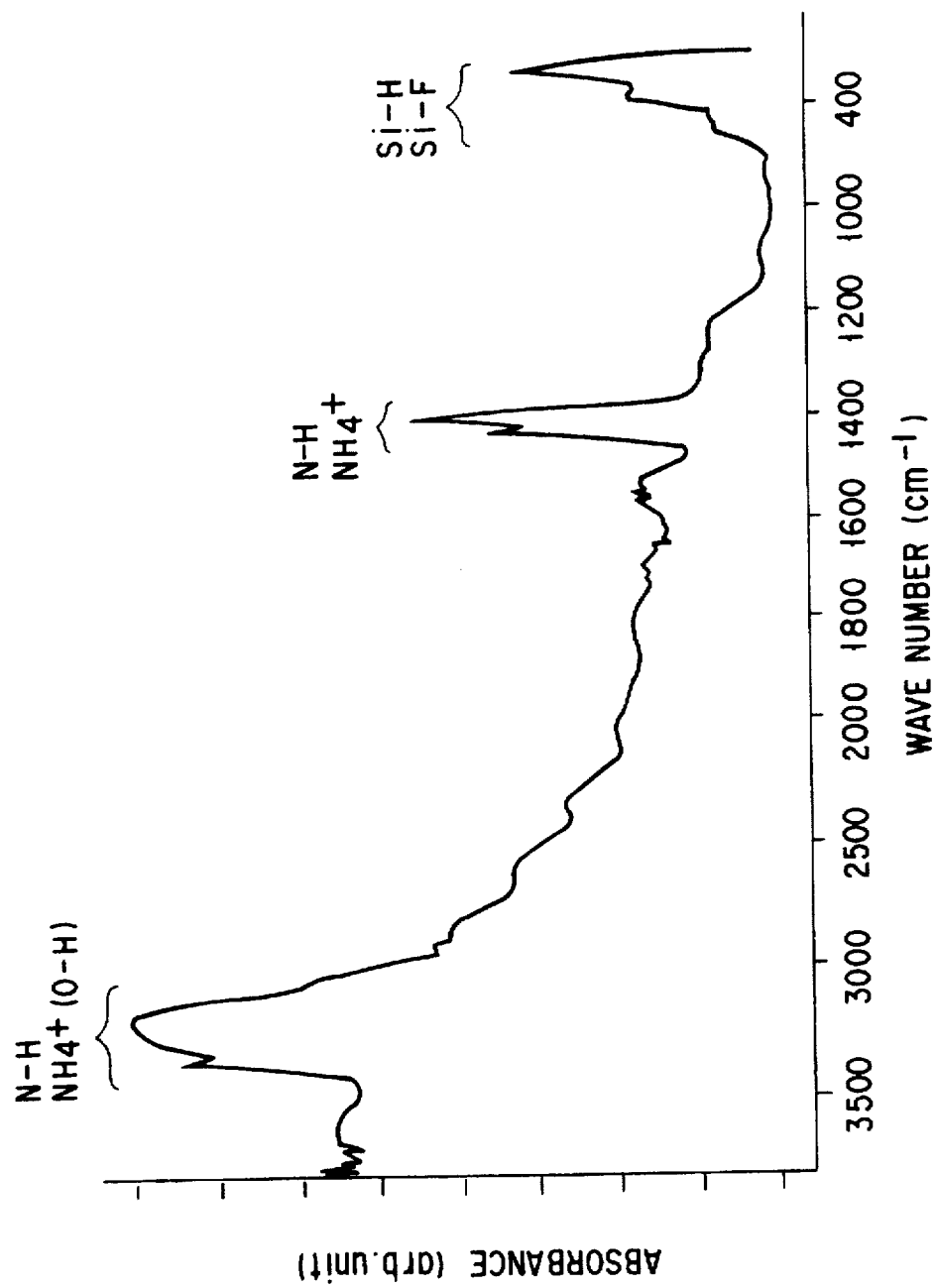
F I G. 15

METHOD OF ETCHING SILICON NITRIDE FILM

CROSS-REFERENCE TO THE RELATED APPLICATION

This application is a continuation-in-part of U.S. patent application Ser. No. 08/397,036 filed on Mar. 1, 1995, and is now abandoned, and which is a continuation of U.S. patent application Ser. No. 08/172,812, filed on Dec. 27, 1973, and is now abandoned.

BACKGROUND OF THE INVENTION

1. Field of the Invention

The present invention relates to a method of etching a silicon nitride film, and more particularly to a selective etching method for selectively etching only a silicon nitride film from a silicon substrate and a silicon oxide film.

2. Description of the Related Art

In recent years, a computer or a communication apparatus incorporates electric circuits comprising a number of transistors and resistors formed on a silicon chip, i.e., large-scale integrated circuits (LSI). For this reason, the performance of the apparatus greatly depends on the performance of an LSI incorporated therein.

The performance of an LSI can be improved by increasing the integration density. To increase the integration density of an LSI, it is necessary to miniaturize elements constituting the LSI. Hence, finer and finer elements have been manufactured in accordance with the increase of the integration density. Under these circumstances, demand for a more accurate pattern size of an element, in fine-processing the element, has been increasing.

In general, a semiconductor integrated circuit is formed as follows: first, an insulating film such as a silicon oxide film and a conductive film such as an aluminum film are formed on a semiconductor substrate made of, for example, silicon; and then the insulating film and the conductive film are patterned. Conventionally, reactive ion etching (RIE); a type of dry etching, has been employed as a technique of fine-processing a substrate, including the insulating film and the conductive film, into a desired pattern. However, in the RIE, since charged particles generated in plasma accelerate due to self-bias and are applied to the substrate to be etched, contamination due to ion implantation or damage such as a defect in crystallization can arise in the base under the substrate to be etched. The contamination or the damage adversely effects the manufacturing of a minute element.

The avoid this problem, chemical dry etching (CDE) or optical excitation etching, not using charged particles, has been employed. The CDE is a method for etching a substrate such as a silicon nitride film through a chemical reaction of an active seed having a high level of reactivity, e.g., a fluorine radical generated from a reactive gas such as $CF_4$. However, in the CDE, since the etching selection ratio of silicon nitride to silicon is about 0.3, a silicon substrate is etched faster than a silicon nitride film. Therefore, when a silicon nitride film formed on a silicon substrate is etched, the silicon nitride film is over-etched, resulting in the silicon substrate being etched to a great amount. Further, in the CDE, although the selection ratio of silicon nitride to silicon oxide is about 5, if the base of the silicon nitride film is a very thin film (about 30 nm thick) such as a silicon oxide film serving as a gate insulating film, the silicon nitride film is over-etched, in which case the thin gate oxide film may be etched. As a result, dielectric breakdown of the gate oxide film may occur.

SUMMARY OF THE INVENTION

The present invention has been made in consideration of the above problems, and its object is to provide a method for selectively etching a silicon nitride film from a silicon substrate or a silicon oxide film.

The above object is achieved by a method for etching a silicon nitride film, comprising the steps of: supplying a fluorine radical, a compound of fluorine and hydrogen, and an oxygen radical close to a substrate having the silicon nitride film; and selectively etching the silicon nitride film from the substrate with the fluorine radical, the compound of fluorine and hydrogen, and the oxygen radical.

The above object is achieved by a method for etching a silicon nitride film, comprises the steps of: exciting gas containing fluorine and oxygen gas, thereby generating a fluorine radical and an oxygen radical; supplying the fluorine radical and the oxygen radical close to a substrate having the silicon nitride film and supplying gas of a compound containing a hydroxyl group close to the substrate; reacting the fluorine radical, the oxygen radical and the compound containing the hydroxyl group, thereby generating a compound of the fluorine radical, the oxygen radical and a compound of fluorine and hydrogen; and selectively etching the silicon nitride film from the substrate with the compound of the fluorine radical, the oxygen radical and the compound of fluorine and hydrogen.

The object can be achieved by a method of etching a silicon nitride film, comprising the steps of generating hydrogen radicals, oxygen radicals and fluorine radicals by exciting a mixed gas containing a fluorine-containing compound, a hydrogen-containing compound, and a gaseous oxygen; supplying said hydrogen radicals, oxygen radicals and fluorine radicals to a region near a substrate having a silicon nitride film; and selectively etching said silicon nitride film formed on said substrate with the hydrogen radicals, oxygen radicals and fluorine radicals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are cross-sectional views for explaining an embodiment of the method of the present invention;

FIG. 2 is a schematic diagram showing a CDE apparatus used in the method of the present invention;

FIG. 4A is a graph showing the surface composition of a silicon nitride film which is not etched;

FIG. 4B is a graph showing the surface composition of a silicon nitride film which has been etched by the method of the present invention;

FIG. 9 schematically shows the construction of a CDE apparatus used for working the method of the present invention;

FIG. 11 is a graph showing the relationship between the light emission intensity of each radical and the H₂O flow rate;

FIG. 15 is a graph showing the FT-IR analytical result of the silicon nitride surface after the etching;

DETAILED DESCRIPTION OF THE PREFERRED EMBODIMENTS

Figure 3:
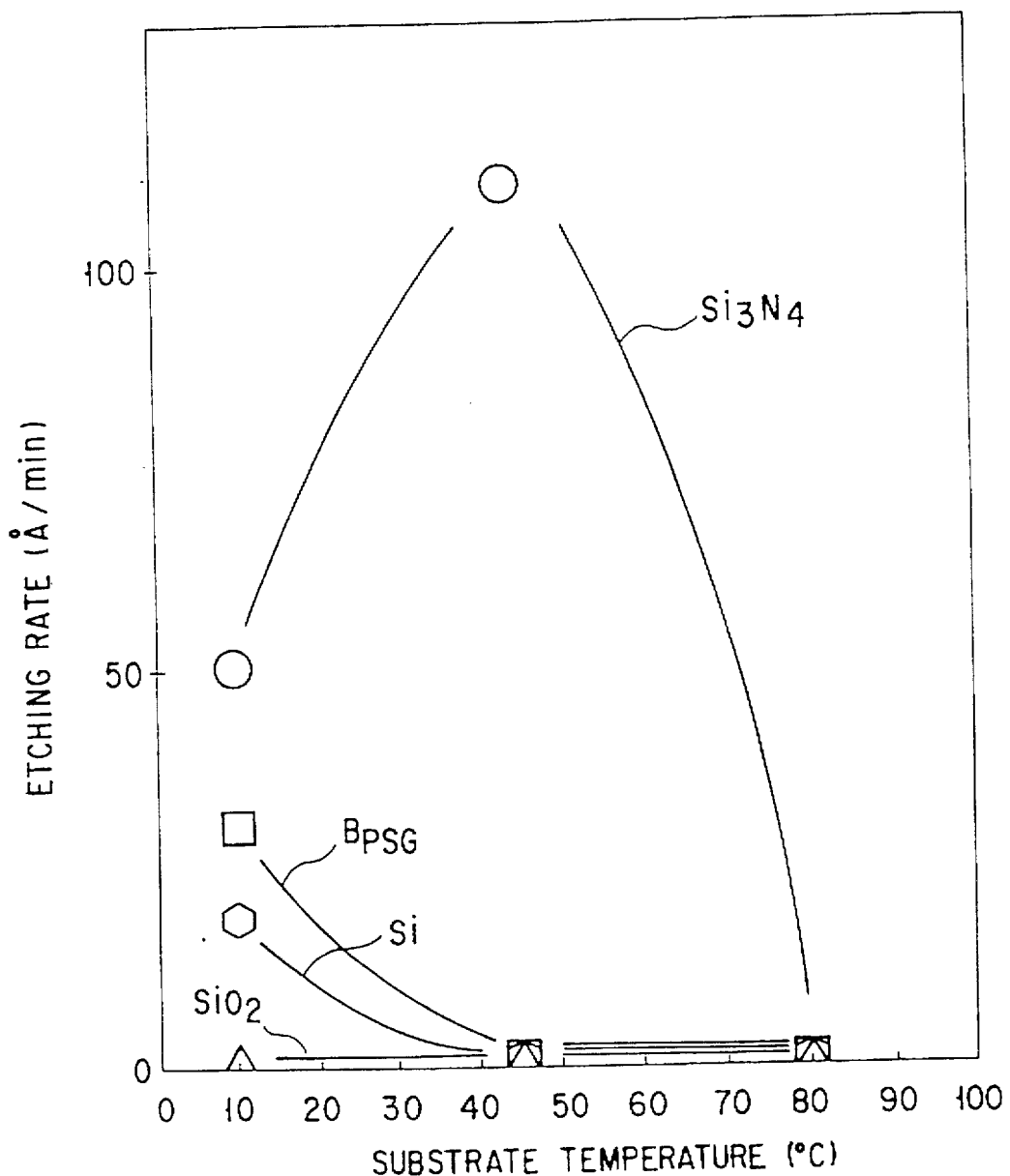
FIG. 3 is a graph showing the temperature dependency of the etching rate in each of the substrates.

The etching method of the present invention is characterized in that a fluorine radical, a compound of fluorine and hydrogen and an oxygen radical are supplied close to a substrate having a silicon nitride film, thereby selectively etching the silicon nitride film from the substrate by the functions of the fluorine radical, the compound of fluorine and hydrogen and the oxygen radical.

In the description, "a substrate" means a silicon substrate, a silicon film formed on a substrate and a silicon oxide film. In addition, the description "selectively etching the silicon nitride film from the substrate" means that the etching of the substrate is suppressed and the silicon nitride film is etched prior to the silicon substrate.

In the present invention, hydrogen fluoride can be used as the compound of fluorine and hydrogen. Further, in the present invention, gas containing fluorine is excited to produce a fluorine radical. As such a gas, CF₄ gas, SF₆ gas, NF₃ gas, XeF gas, F₂ gas or a mixture of these gases can be used. Further, O₂ gas, N₂O gas, or the like can be used as an oxygen radical. It is possible to use a mixture of the gas containing fluorine and O₂ gases. As a compound containing a hydroxyl for generating hydrogen fluoride, H₂O, H₂O₂, alcohol such as methanol, ethanol, ethylene glycol, glycerine, and a mixture thereof can be used.

The hydrogen-containing material used in the present invention includes, for example, H₂O, H₂ and NH₃.

A mechanism for selectively etching a silicon nitride film from a substrate will be described below. In the description, CF₄ gas is used as the gas containing fluorine, H₂O gas is used as the compound containing a hydroxyl, O₂ gas is used as the oxygen radical source and a silicon substrate is used as the substrate.

When CF₄ gas and O₂ gas are excited, active seeds such as CO*, COF₂*, COF*, are generated. The fluorine radical is transferred near the silicon substrate, using the active seeds as carriers. Then, the fluorine radical and H₂O gas supplied close to the silicon substrate react as follows:

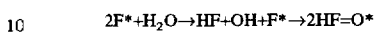

Thus, the fluorine radical, hydrogen fluoride and the oxygen radical coexist near the silicon substrate. It appears that the following three reactions take place competitively: a first reaction in which the oxygen radical oxidizes the silicon substrate, thereby forming a silicon oxide film on a surface of the silicon substrate; a second reaction in which the hydrogen fluoride etches the silicon oxide film; and a third reaction in which the fluorine radical etches the silicon nitride film. With regard to the three reactions, since the first and the second reactions take place at the substantially same rate, the third reaction can proceeds selectively. Therefore, the silicon nitride film can be selectively etched, prior to the silicon substrate.

An embodiment of the present invention will now be described in detail with reference to the accompanying drawings.

(EXAMPLE 1)

First, an apparatus for etching a silicon nitride film 12 formed on a silicon substrate (hereinafter referred to as substrate) 11, as shown in FIG. 1A, will be described. The silicon nitride film 12 is etched by, for example, a CDE apparatus as shown in FIG. 2. In FIG. 2, a reference numeral 21 denotes a chamber. A silicon substrate 31 to be processed is contained in the chamber 21. The silicon substrate 31 is mounted on a susceptor 22. The susceptor 22 has a temperature control mechanism such as a pipe for flowing a thermostated water to control the temperature of the silicon substrate 31.

A first gas introducing pipe 24 is connected to an upper portion of the chamber 21 to introduce a fluorine radical and an oxygen radical into the chamber 21. One end of the first gas introducing pipe 24 is connected through a mass flow controller 32 to a gas supply section (not shown) for supplying CF₄ gas (a fluorine radical source) and O₂ gas (an oxygen radical source). A discharge tube 26, to which a microwave power source 25 is connected, is inserted in a middle portion of the first gas introducing pipe 24. When a voltage is applied to the microwave power source 25, the gas flowing through the pipe 24 is changed to plasma in the discharge tube 26, thereby forming active seeds including a fluorine radical and an oxygen radical. Thus, since the discharge tube 26 for generating active seed is separated from the chamber 21 containing the silicon substrate 31, it is possible to supply active seeds having a high reactivity close to the silicon substrate 31.

A second gas introducing pipe 28 is connected to an upper portion of the chamber 21 to introduce a gas of a compound containing a hydroxyl such as H₂O gas into the chamber 21. One end of the second gas introducing pipe 28 is connected through a mass flow controller 33 to a gas supply section (not shown) for supplying gas containing a hydroxyl. The first and second gas introducing pipes 24 and 28 are connected to a gas supply nozzle unit 29 comprising a plurality of double nozzles, which is located precisely above the silicon substrate 31. More specifically, the first gas introduction tube 24 is connected to inner tubes of the double nozzles and the second gas introduction pipe 28 is connected to outer tubes of the double nozzles. Therefore, the active seeds containing the fluorine radical are injected through the inner tubes toward the silicon substrate 31 and the $H_2O$ gas is introduced through the outer tubes toward the silicon substrate 31.

An exhaust pipe 23 is connected to a bottom portion of the chamber 21. The pressure in the chamber 21 is maintained at a desired level by inlet means (not shown) connected to the exhaust pipe 23.

A method for etching the silicon nitride film 12, using the above-described CDE apparatus, will now be described.

First, the silicon substrate 31 is heated to 45° C. by the temperature control mechanism of the susceptor 22. Then, a mixture of $CF_4$ gas and $O_2$ gas is caused to flow through the first gas introducing pipe 24. At this time, the flow rates of the $CF_4$ gas and the $O_2$ gas are 360 SCCM and 100 SCCM, respectively. Simultaneously, $H_2O$ gas is introduced through the second gas introducing pipe 28 into the chamber 21 at a flow rate of 1000 SCCM. The chamber 21 is vacuumed so that the pressure therein is maintained at 0.3 Torr.

When the silicon nitride film 12 is etched on the aforementioned conditions for two minutes, the silicon nitride film 12 is removed completely, while the silicon substrate thereunder is not etched at all, as shown in FIG. 1B. Thus, according to the present invention, the silicon nitride film 12 can be selectively removed from the silicon substrate 11 with a simple etching step.

Conventionally, when a silicon nitride film is to be etched from a silicon substrate, a silicon oxide film, having an etching selection ratio higher than that of silicon, is formed on that portion of the silicon substrate on which the silicon nitride film is not formed, in consideration of the face that silicon nitride is more difficult to oxidize than silicon. Then, the silicon nitride film is selectively etched using the silicon oxide film as a mask. Finally, the silicon oxide film is removed. As compared to this conventional etching method, the method of the present invention is more advantageous in that it is unnecessary to coat the silicon substrate with a silicon oxide film and remove the silicon oxide film. Thus, the number of manufacturing steps is considerably reduced.

Next, the relationship between the substrate temperature and the etching rate in the etching method of the present invention will be described.

FIG. 3 is a graph showing the relationship between the substrate temperature and the etching rate with respect to four substrates to be etched: an $Si_3N_4$ substrate, a BPSG substrate, an Si substrate and an $SiO_2$ substrate. These substrates are etched by use of the CDE apparatus shown in FIG. 2, on the conditions that a mixture of $CF_4$ gas at a flow rate of 360 SCCM and $O_2$ gas at a flow rate of 100 SCCM is introduced through the first introducing pipe into the chamber, $H_2O$ gas at a flow rate of 1000 SCCM is introduced through the second introducing pipe, and the pressure in the chamber is set at 0.3 Torr.

Since $Si_3N_4$ is more difficult to oxidize with a oxygen radical than Si, and a natural oxide film is not easily formed on $Si_3N_4$, the $Si_3N_4$ is etched by a fluorine radical. As shown in FIG. 3, when the substrate temperature is lower than 10° C., since the reactivity of $Si_3N_4$ and the fluorine radical is low, the etching rate in the $Si_3N_4$ substrate is low. In the range of the substrate temperature of 10° C. to 45° C., since the reactivity of $Si_3N_4$ and the fluorine radical increases as the substrate temperature rises, the etching rate in the $Si_3N_4$ substrate is gradually increased. When the substrate temperature is 45° C., the silicon nitride ($Si_3N_4$) is etched at the highest rate. This temperature is most desirable, since the etching rates in silicon (Si) and silicon oxide ($SiO_2$) are substantially 0.

The reaction mechanism of the present invention will be explained as follows. In the first reaction, a silicon oxide film is formed on the surface of a silicon substrate, since a silicon nitride film is more difficult to oxidize as compared to silicon. The first reaction is accelerated in accordance with the rise of the temperature of the substrate. In contrast, the second reaction, in which the silicon oxide film is etched by hydrogen fluoride, is accelerated as the temperature of the substrate is lowered, for the following reasons. In general, hydrogen fluoride has a lower steam pressure as compared to the other gases. Hence the temperature dependency of the amount of hydrogen fluoride which adheres to the substrate to be processed is high even in a narrow temperature range of 10° C. to 80° C. In other words, the lower the temperature of the BPSG substrate, the higher the etching rate therein. In FIG. 3, the etching rate in BPSG differs from that in $SiO_2$, since hydrogen fluoride generated from a fluorine radical and $H_2O$ gas hardly reacts with a tight Si—O bond as in a silicon thermal oxide film, but easily reacts with a BPSG film in which the Si—O bond is loose. The third reaction, in which the silicon nitride film is etched by the fluorine radical, gradually accelerated in accordance with the rise of the temperature of the substrate. The reaction of the present invention is considered to be a competitive reaction of the first to third reactions.

As shown in FIG. 3, when the substrate temperature is lower than 45° C., since the etching of the silicon oxide film by hydrogen fluoride (the second reaction) is prior to the formation of the silicon oxide film on the silicon surface (the first reaction), silicon is etched by the fluorine radical.

On the other hand, when the substrate temperature is higher than 45° C., since the competitive relationship between the second reaction in which hydrogen fluoride etches $SiO_2$ and the first reaction in which $SiO_2$ is formed by the oxygen radical is changed, the rate in etching $Si_3N_4$ is lowered in accordance with the rise of the substrate temperature. In other words, when the substrate temperature is higher than 45° C., since the amount of hydrogen fluoride which adheres to the surface of the $Si_3N_4$ substrate decreases, the silicon oxide film formed on the $Si_3N_4$ substrate by the oxygen radical is not easily etched. Further, when the substrate temperature exceeds 80° C., since the silicon oxide film formed on the $Si_3N_4$ substrate serves as an etching-resistant film, it prevents $Si_3N_4$ from being etched by the fluorine radical, i.e., the $Si_3N_4$ substrate is not etched.

As described above, the etching rate in BPSG increases as the substrate temperature is lowered, and it is substantially 0 when the substrate temperature is 45° C. or higher. The effect of the present invention is remarkable when the substrate temperature is 20° C. to 60° C., preferably 45° C. to 60° C.

FIGS. 4A and 4B are characteristic diagrams for explaining the surface conditions of a silicon nitride film. The characteristic diagrams shown the results of analyses of the surface of a silicon nitride film by an XPS (X-ray Photo Spectroscopy) method. FIG. 4A shows the result of an analysis of a silicon nitride film before etching and FIG. 4B shows the result of an analysis of the silicon nitride film when the etching is performed at a substrate temperature of 80° C.

As can be seen from FIG. 4B, when the substrate is etched at the temperature of 80° C., intensity peaks appear at values of binding energy indicating that a silicon nitride film and a silicon oxide film exist. However, as shown in FIG. 4A, in the unetched substrate, an intensity peak appears only at a value of binding energy indicating that a silicon nitride film exists. Theses results show that a silicon oxide film is formed on the surface of a silicon nitride film when the substrate temperature is 80° C. Thus, since a native oxide film of about several nm thick is formed on the silicon surface and a silicon oxide film is also formed thereon by an oxygen radical, these oxide films prevent silicon from being etched by a fluorine radical. Therefore, when the substrate temperature is 45° C. or higher, a silicon oxide film serving as an etching-resistant film is formed on the silicon surface as in the case of etching a silicon nitride film, the etching rate in silicon becomes substantially 0.

As has been described above, according to the method of etching a silicon nitride film of the present invention, since a fluorine radical, hydrogen fluoride and an oxygen radical coexist near a silicon substrate, three reactions (formation of a silicon oxide film by the oxygen radical, etching of the silicon oxide film by hydrogen fluoride and etching of the silicon substrate and the silicon nitride film by the fluorine radical) competitively take place. Conditions, on which the etching of the silicon nitride film by the fluorine radical is prior to the other two reactions, are selected.

For example, the amount of hydrogen fluoride which adheres to the silicon oxide film and the amount of part of the silicon oxide film which is etched can be changed by changing the substrate temperature. Further, if the amount of part of the silicon oxide film which is etched by hydrogen fluoride is changed, the rate at which silicon oxide is formed by the oxygen radical (etching resistance) can be changed, resulting in change of the reactivity of the fluorine radical (etching capacity).

Therefore, when the substrate temperature is set at about 45° C., the etching capacity of the fluorine radical is dominant with respect to the silicon nitride film, while the etching resistance of the silicon oxide film is dominant with respect to the silicon substrate. As a result, the silicon nitride film can be selectively etched from the silicon substrate. Note that the condition, on which the etching of the silicon nitride film by the fluorine radical proceeds with priority, is not limited to the temperature of the substrate. The condition can also be obtained by controlling the flow rate of the gases to change the amounts of the fluorine radical, hydrogen fluoride and the oxygen radical existing near the silicon substrate.

The influence of the conditions other than the substrate temperature on the etching rate in each of the substrates (BPSG, Si, and $Si_3N_4$) will now be described.

Figure 5:
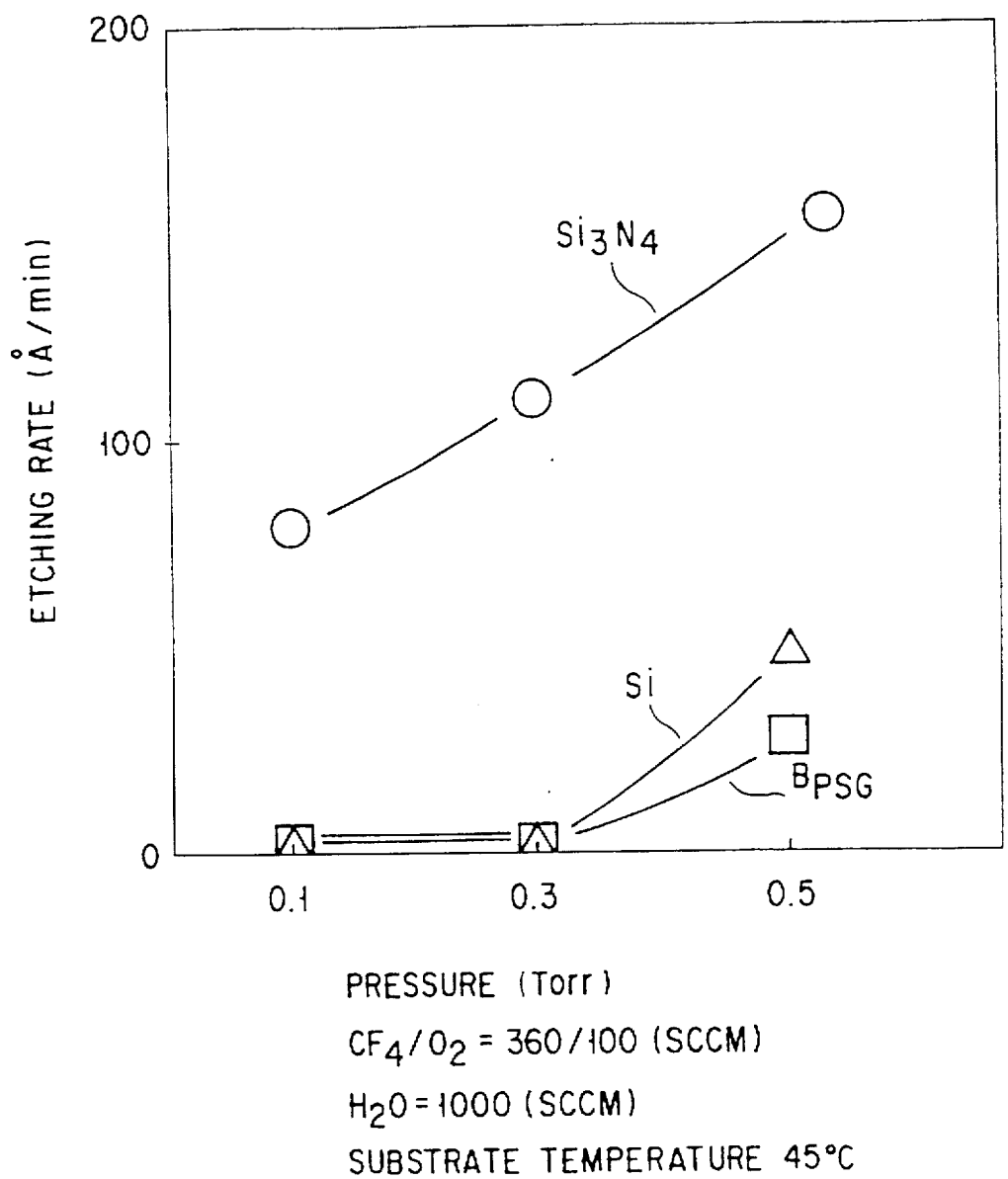
FIG. 5 is a graph showing the pressure dependency of the etching rate in each of the substrates.

FIG. 5 is a graph showing the pressure dependency of the etching rate in each of the substrates, in which the conditions other than the pressure are the same as those in the above example. As clear from FIG. 5, if the pressure is 0.5 Torr or lower, preferably 0.3 Torr or lower, the silicon nitride film can be selectively etched, without etching BPSG or silicon. The pressure dependency of the etching rate will be explained as follows.

When the pressure is increased, the amount of the fluorine radical supplied to the substrate is also increased. Since the silicon nitride film is etched by the fluorine radical, the etching rate in the silicon nitride film is also increased in accordance with the pressure. In addition, when the pressure is increased, the amount of hydrogen fluoride which adheres to the substrate is also increased. Hence, BPSG, which is not etched when the pressure is lower than 0.3 Torr, is etched by hydrogen fluoride. Similarly, when the pressure is higher than 0.3 Torr, since the native oxide film on the silicon substrate is etched by hydrogen fluoride, the exposed silicon substrate is etched by the fluorine radical. Since the rate at which the substrate is oxidized by the oxygen radical is determined by the substrate temperature, when the substrate temperature is constant (45° C.), the oxidation rate is also constant. Therefore, the etching rates in BPSG and silicon are gradually increased, as the pressure increases above 0.3 Torr.

Figure 6:
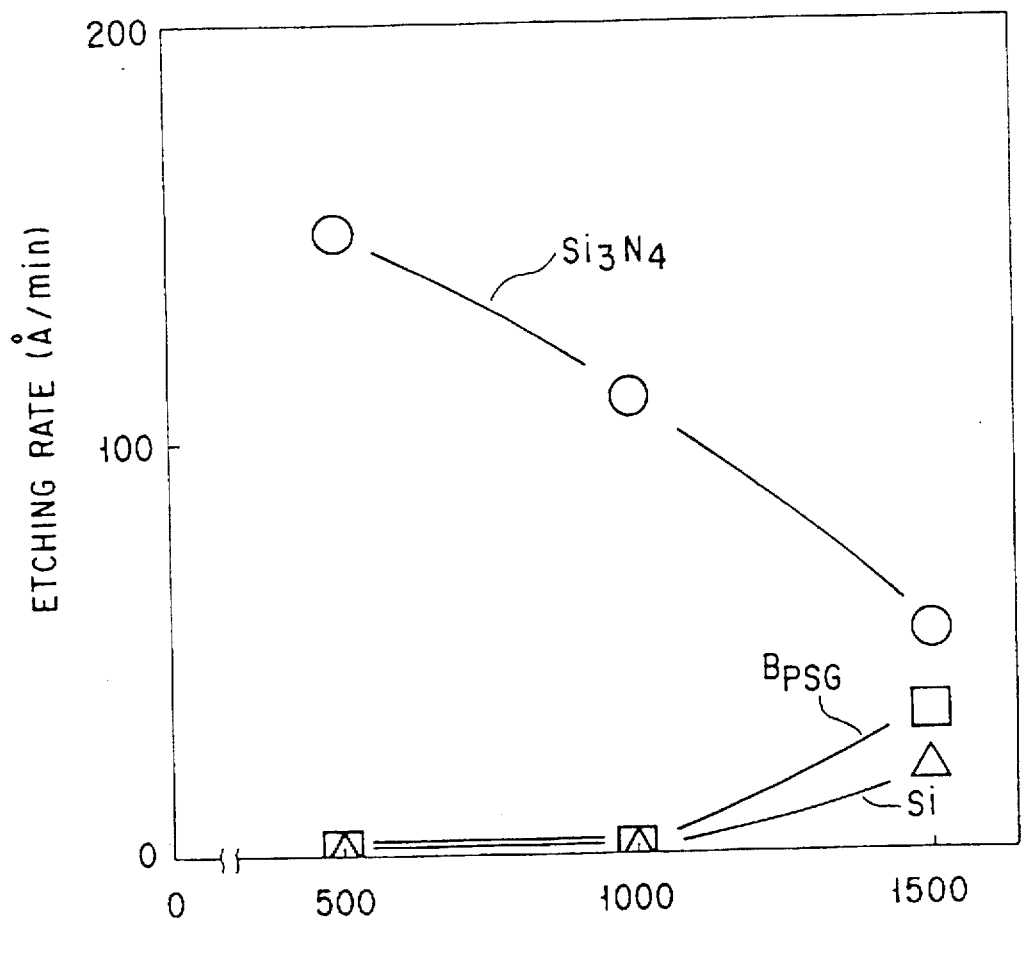
FIG. 6 is a graph showing the H₂O gas flow rate dependency of the etching rate in each of the substrates.

FIG. 6 is a graph showing the $H_2O$ gas flow rate dependency of the etching rate in each of the substrates, in which the conditions other than the $H_2O$ gas are the same as those in the above examples. As clear from FIG. 6, if the flow rate of the $H_2O$ gas is 1000 SCCM or lower, the silicon nitride film can be selectively etched, without etching BPSG or silicon. The $H_2O$ gas flow rate dependency of the etching rate will be explained as follows.

Since the flow rates of $CF_4$ and $O_2$ gases are constant, the amount of the generated fluorine radical is also constant. When the flow rate of the $H_2O$ gas is increased, the amount of the fluorine radical which reacts with $H_2O$ is increased. Therefore, the etching rate in the silicon nitride film is decreased in accordance with the increase of the flow rate of the $H_2O$ gas. In addition, when the flow rare of the $H_2O$ gas is increased, since the reaction of $H_2O$ and the fluorine radical proceeds, the amount of the generated hydrogen fluoride is also increased. For this reason, the influence of hydrogen fluoride on the etching of BPSG becomes greater in accordance with the increase of the flow rate of the $H_2O$ gas, resulting in increase of the etching rate in BPSG. Similarly, the influence of hydrogen fluoride on the etching of the native oxide film on the silicon surface becomes greater in accordance with the increase of the flow rate of the $H_2O$ gas, resulting in increase of the rate at which silicon is etched by the fluorine radical.

Figure 7:
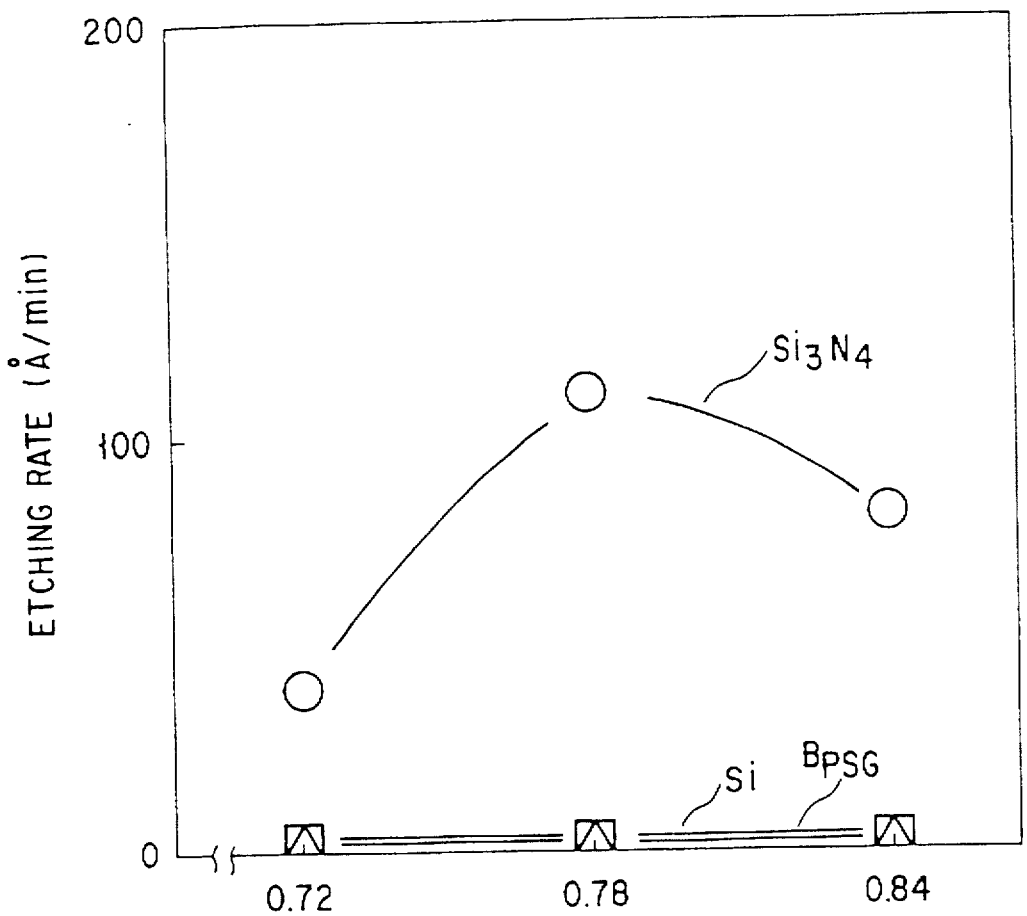
FIG. 7 is a graph showing the CF₄/(CF₄+O₂) flow ratio dependency of the etching rate in each of the substrates.

FIG. 7 is a graph showing the $CF_4/(CF_4+O_2)$ flow ratio dependency of the etching rate in each of the substrates, in a case where the sum of the flow of $CF_4$ gas and $O_2$ gas is constant (460 SCCM). Note that the conditions other than the flow ratio are the same as those in the above examples. As clear from FIG. 7, the etching rates in silicon and BPSG are substantially 0, irrespective of the flow ratio $CF_4/(CF_4+O_2)$. In contrast, the etching rate in the silicon nitride film is represented by a curve having a peak value at the flow ratio $CF_4/(CF_4+O_2)$ of 0.78. The $CF_4/(CF_4+O_2)$ flow ratio dependency of the etching rate will be explained as follows.

When $CF_4$ gas alone is changed to plasma, a fluorine radical and $CF_x$ (x=1, 2, 3) are formed. However, since most of the fluorine radical is re-bonded with $CF_x$, most fluorine radical disappear. In this example, since the mixture of $CF_4$ gas and $O_2$ gas is used as gas containing fluorine, $CF_x$ reacts with $O_2$ gas. As a result, $CF_2O$ and the like are generated. Therefore, the disappearance of fluorine radical through reaction of $CF_x$ gas and the fluorine radical is suppressed. In this case, the higher the flow rate of the $O_2$ gas, the greater the amount of the residual fluorine radical basically and the higher the etching rate. However, since the flow of the mixture gas is constant, when the $O_2$ gas flow is increased, the flow of the $CF_4$ gas is relatively decreased. As a result, the etching rate in the silicon nitride film is the greatest when the $CF_4/(CF_4+O_2)$ ratio is of a specific value. It is preferable that the $CF_4/(CF_4+O_2)$ ratio falls in the range of 0.72 to 0.84. More preferably, the $CF_4/(CF_4+O_2)$ ratio is 0.78. Although $H_2O$ gas is introduced in addition to $O_2$ gas, since the flow rate of the $H_2O$ gas is constant, the amount of the fluorine radical which disappears through the reaction with $H_2O$ is also constant. In addition, when the fluorine radical is increased, the amount of hydrogen fluoride generated through the reaction of the fluorine radical and $H_2O$ is also increased. However, as shown in FIG. 3, since the substrate is not etched by hydrogen fluoride when the temperature is 45° C. or higher, the etching rates in silicon and BPSG are substantially 0, irrespective of the flow ratio $CF_4/(CF_4+O_2)$.

Figure 8A:
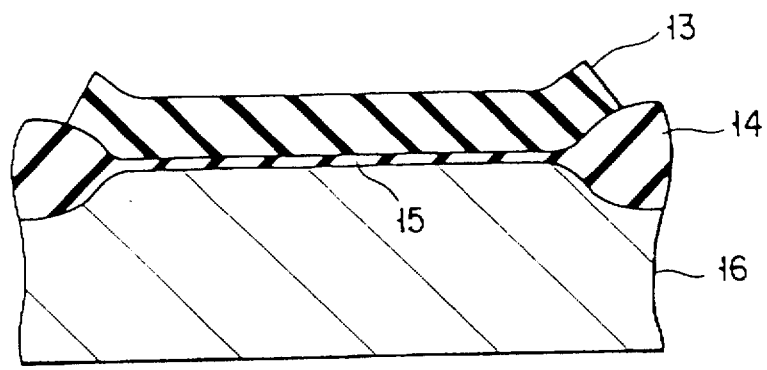
FIGS. 8A and 8B are cross-sectional views for explaining another embodiment of the present invention.
Figure 8B:
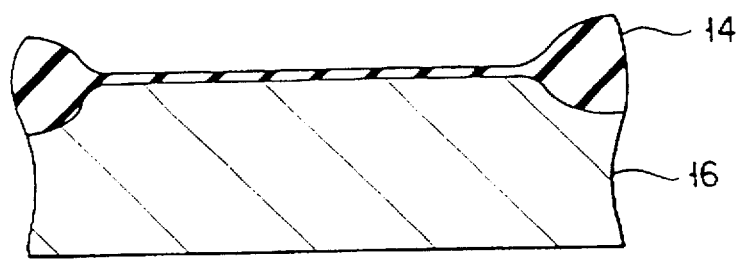

FIGS. 8A and 8B are cross-sectional views for explaining another embodiment of the present invention. In this embodiment, a silicon nitride film formed on a silicon oxide film is etched.

FIG. 8A shows a cross-sectional views of an element obtained by forming a silicon nitride film 13 having a thickness of 100 nm on an element region of a silicon substrate 16, and then forming a field oxide film 14 and a gate oxide film 15 by a thermal oxidization method. When this element is subjected to the conditions as in the above embodiment to etch the silicon nitride film 13 for 5 minutes, only the silicon nitride film 13 is etched without etching the gate oxide film 15, as shown in FIG. 8B, although it is over-etched 50%.

In the above embodiments, active seeds containing a fluorine radical is introduced into a reaction chamber through the inner tubes of the double nozzles and $H_2O$ gas is introduced through the outer tubes of the double nozzles, so that both the introduced gases are mixed precisely above a substrate to be processed. However, the method of introducing gases into the chamber is not limited to the above, so long as a fluorine radical, an oxygen radical and $H_2O$ gas coexist near the substrate to be processed. Further, in the above embodiments, $CF_4$ gas, $O_2$ gas and $H_2O$ gas are used to cause a fluorine radical, an oxygen radical, and $H_2O$ gas to coexist. However, it is possible to use, for example, $O_2$ gas, $F_2$ gas and $H_2$ gas, excite only $O_2$ gas and supply unexcited crude $F_2$ and $H_2O$ gases. It is also possible to use a gas of a compound containing hydrogen and a gas of a compound containing O and F, excite only the gas containing hydrogen and supply unexcited crude gas of the compound containing O and F.

(EXAMPLE 2)

In the method of the present invention for etching a silicon nitride film, it is also possible to use hydrogen radicals, oxygen radicals and fluorine radicals which are generated by exciting a mixed gas containing a fluorine compound, a hydrogen compound and a gaseous oxygen. Let us describe the particular example of the present invention.

FIG. 9 schematically shows the construction of a CDE apparatus used for working the method of the present invention. As shown in the drawing, the apparatus comprises a chamber 45. A silicon substrate 46 which is to be etched is housed in the chamber 45. The silicon substrate 46 is supported by a susceptor 47 having a temperature control mechanism including, for example, pipes for water of a constant temperature so as to control the temperature of the silicon substrate 46. An exhaust port 48 is formed in the bottom of the chamber 45.

A gas inlet pipe 43 is connected to an upper region of the chamber 45 for introducing fluorine radicals, oxygen radicals and hydrogen radicals into the chamber 45. The gas inlet pipe 43 is connected via a flow controller to a discharge tube 42 having a gas inlet port 41 for introducing a mixed gas. Further, a microwave waveguide 44 is connected to the discharge tube 42.

In the CDE apparatus shown in FIG. 9, a mixed gas introduced through the gas inlet port 41, e.g., a mixed gas of $CF_4/O_2/H_2O$, is converted into a plasma by the microwave waveguide 44 so as to generate active species including ions and radicals. However, the ion has a short life and, thus, is deactivated within the gas inlet pipe 43 before the ion is introduced into the chamber 45. As a result, the radicals having a long life are selectively introduced into the chamber 45 so as to carry out reactions with the substrate to be treated.

Figure 10:
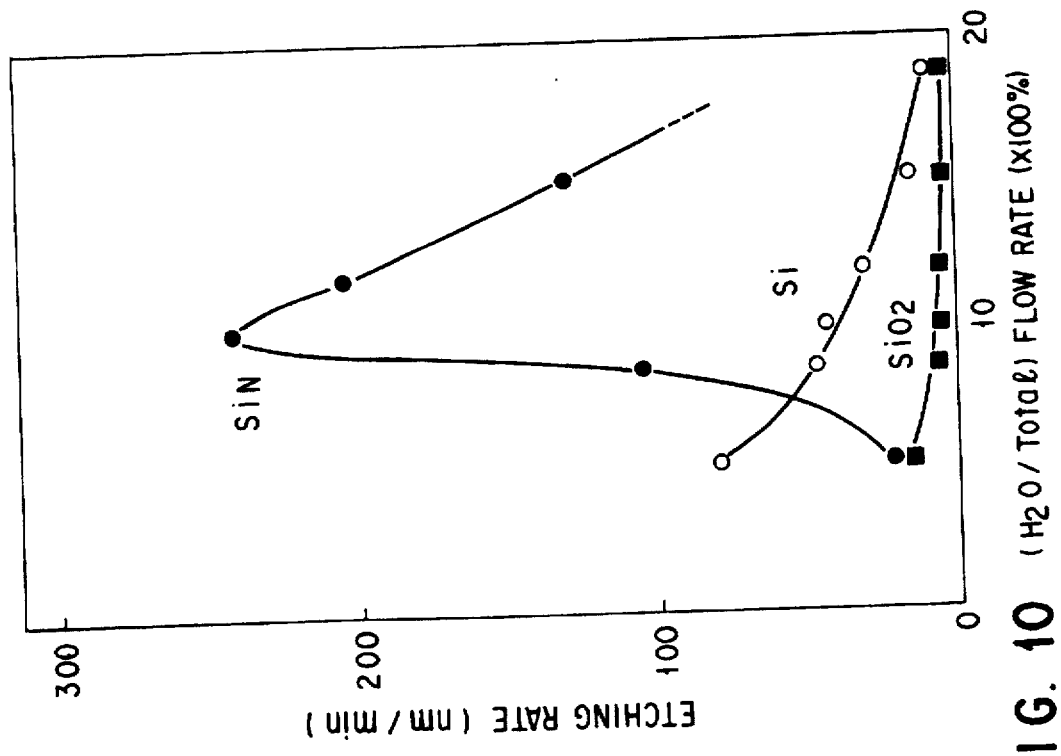
FIG. 10 is a graph showing the relationship between the etching rate of a substrate to be etched and a ratio of H₂O flow rate to the total flow rate.

The CDE apparatus shown in FIG. 9 was operated under the conditions of: power=700 W, pressure=70 Pa, total flow rate=590 SCCM, a ratio of $CF_4$ flow rate to $O_2$ gas flow rate ($CF_4/O_2$)=270/270 SCCM, and susceptor temperature=25° C. Under these conditions, it was examined how the etching rate of each of SiN, Si and $SiO_2$ would be affected by a ratio of $H_2O$ flow rate to the total flow rate, with the results as shown in FIG. 10. As clearly seen from FIG. 10, the etching rate of each of Si and $SiO_2$ was found to monotonously decrease with increase in the water amount. On the other hand, the etching rate of SiN was found to reach a peak at 10% of the $H_2O$ addition (or $H_2O$ flow rate of 60 SCCM). Since these materials differ from each other in the etching rate as pointed out above, it is possible to remove selectively a silicon nitride film formed on a silicon substrate or on a silicon oxide film.

Then, measured was the relationship between the flow rate of $H_2O$ and the intensity of light emitted from each of the fluorine radical, oxygen radical and hydrogen radical in the plasma-generating section of the CDE apparatus shown in FIG. 9, with the results as shown in FIG. 11. It is clearly seen from FIG. 11 that the intensity of light emitted from each of fluorine radical and oxygen radical is decreased with increase in the $H_2O$ flow rate. On the other hand, the intensity of light emitted from hydrogen radical is increased with increase in the $H_2O$ flow rate. The experimental data shown in FIGS. 10 and 11 are considered to be relevant to each other, as follows.

Specifically, each of Si and $SiO_2$ is considered to be etched by fluorine radical alone. If the $H_2O$ flow rate is increased, hydrogen radicals generated from $H_2O$ are considered to scavenge the fluorine radicals generated from $CF_4$ so as to form HF. Since the amount of the fluorine radicals supplied to the body to be etched is decreased because of this reaction, the etching rate of each of Si and $SiO_2$ is decreased with increase in the $H_2O$ flow rate.

On the other hand, SiN is etched by the reaction denoted by formula (1) below:

$$Si_3N_4+12F*\uparrow+12H*\uparrow\rightarrow 3(SiF_4)\uparrow+4(NH_3)\uparrow \qquad (1)$$

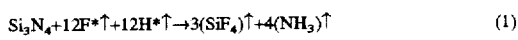

As seen from formula (1), both fluorine radical and hydrogen radical are involved in the etching of SiN. As described previously, an increase in the $H_2O$ flow rate causes a decrease in the amount of the fluorine radicals and an increase in the amount of the hydrogen radicals. Such being the situation, the etching rate of SiN is considered to reach a peak where the fluorine radicals and hydrogen radicals are present in good balance, e.g., $H_2O$ flow rate of 60 SCCM in FIG. 10.

Figure 12:
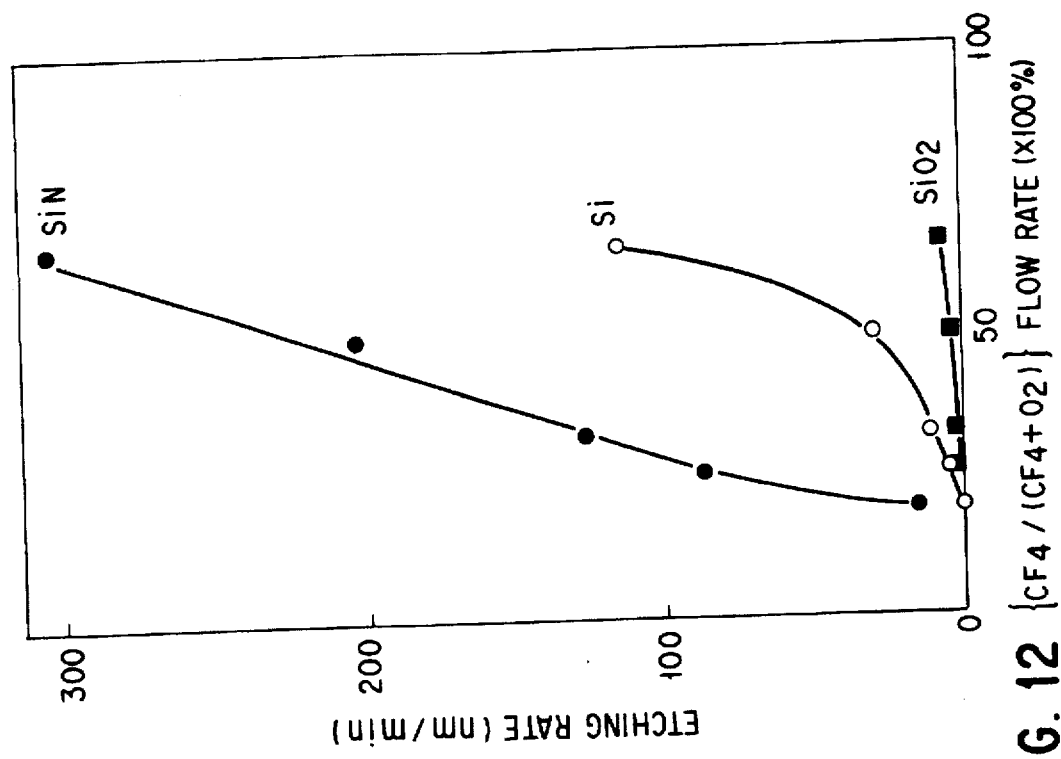
FIG. 12 is a graph showing the relationship between the etching rate of a substrate to be etched and a ratio of a flow rate of CF₄ to the sum of flow rates of CF₄ and O₂.

Then, the CDE apparatus shown in FIG. 9 was operated under the conditions of: power=700 W, pressure=70 Pa, and $H_2O$ flow rate=60 SCCM. Under these conditions, it was examined how the etching rate of each of SiN, Si and $SiO_2$ would be affected by a ratio of $CF_4$ flow rate to the sum of flow rates of $CF_4$ and $O_2$, with the results as shown in FIG. 12. It is clearly seen from FIG. 12 that the etching rate of any of SiN, Si and $SiO_2$ is decreased with increase in the $O_2$ flow rate. It is also seen clearly that the decrease in the etching rate of Si is markedly greater than that of SiN. It follows that a silicon nitride film formed on a silicon substrate can be selectively etched with a high etching selectivity by increasing the $O_2$ flow rate.

To be more specific, the surface of each of SiN and Si layers tends to be oxidized easily in the case of increasing the $O_2$ flow rate, leading to a low etching rate. However, Si is more likely to be oxidized than SiN, with the result that the decrease in the etching rate of Si is greater than that of SiN. As a result, a silicon nitride film on a silicon substrate can be selectively etched with a high etching selectivity by increasing the $O_2$ flow rate, as pointed out above. In this embodiment, the etching rate of SiN was found to be 30 times as high as that of Si.

Figure 13:
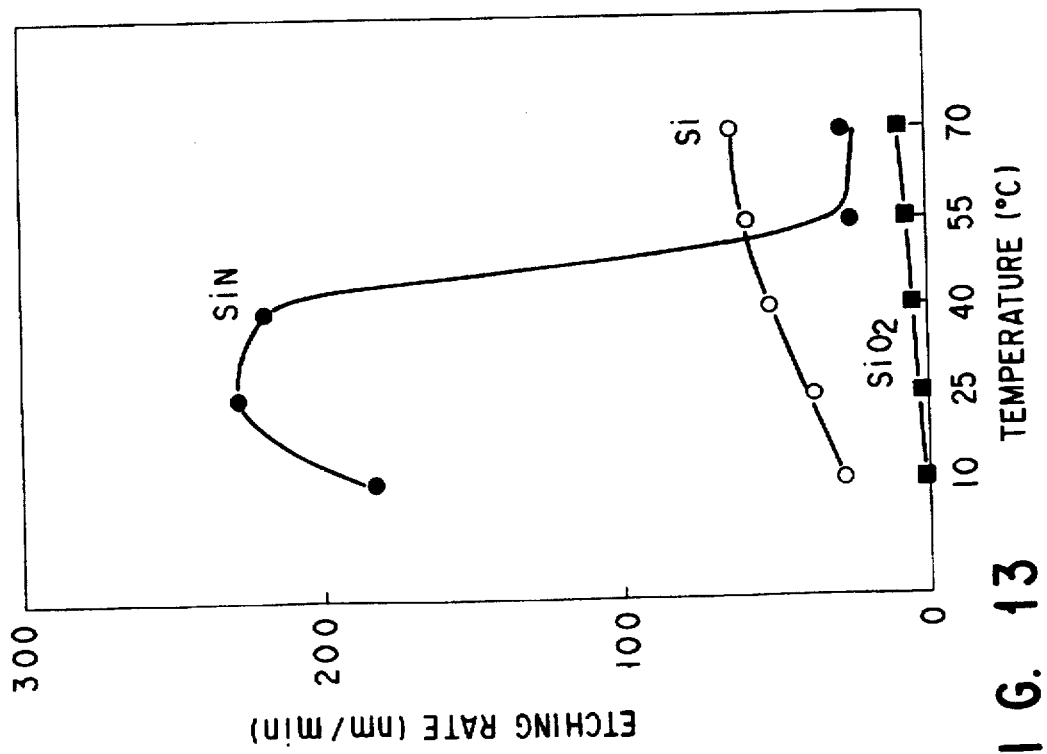
FIG. 13 is a graph showing the relationship between the etching rate of a substrate to be etched and the temperature.

Then, the CDE apparatus shown in FIG. 9 was operated under the conditions of: power=700 W, pressure=70 Pa, and gas flow rates of $CF_4/O_2/H_2O$=270/270/60 SCCM. Under these conditions, it was examined how the etching rate of SiN, $SiO_2$ and Si would be affected by temperature, with the results as shown in FIG. 13. It is clearly seen from FIG. 13 that the etching rate of each of Si and $SiO_2$ is monotonously increased with increase in temperature. However, the etching rate of SiN is markedly decreased if the temperature exceeds 50° C. It follows that it is necessary to maintain the etching temperature at 50° C. or less for selectively etching a silicon nitride film formed on a silicon substrate or on a silicon oxide film.

To be more specific, the fluorine radical alone is considered to be involved in the etching of Si and $SiO_2$, as described previously. Thus, the probability of reaction between the fluorine radical and the object to be etched is increased with increase in temperature, leading to a monotonous increase in the etching rate. On the other hand, both fluorine radical and hydrogen radical are involved in the etching of SiN as described previously. What should be noted is that these fluorine and hydrogen radicals differ from each other in the temperature characteristics of etching reaction, with the result that the etching reaction of SiN proceeds only within a suitable temperature range.

Figure 14:
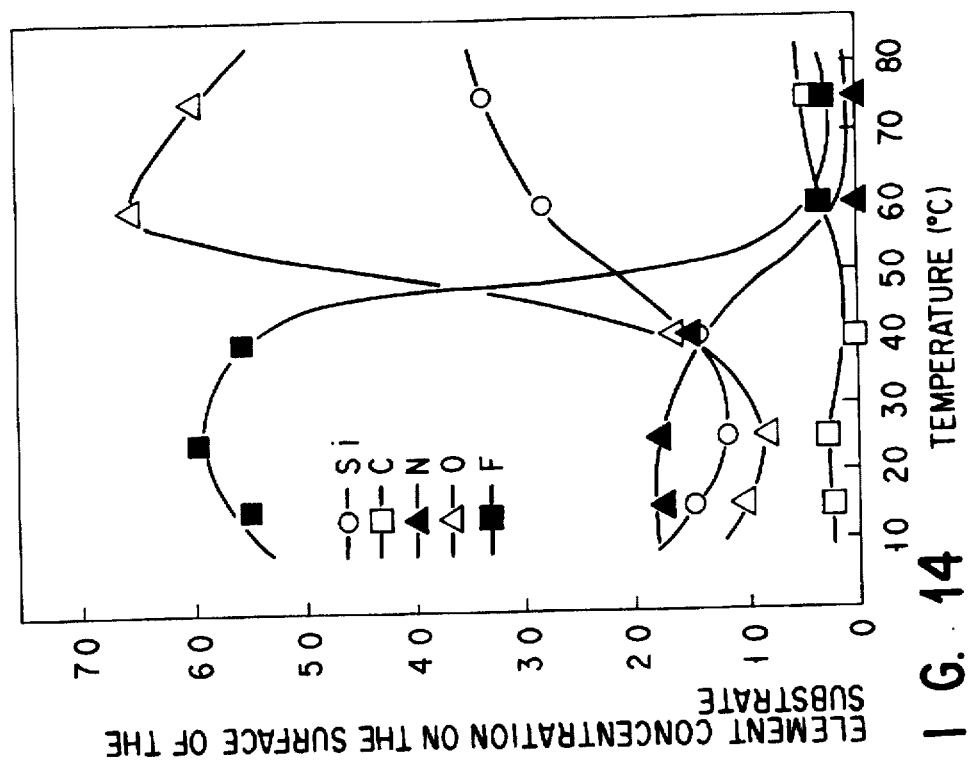
FIG. 14 is a graph showing the relationship between the element concentration on the surface of the substrate after etching and the temperature.

Examined was the relationship between temperature of the object to be etched and element concentration on the surface of a SiN layer after an etching treatment, with the results as shown in FIG. 14. As apparent from FIG. 14, the fluorine concentration on the surface of the SiN layer is rapidly decreased, if the temperature of the object to be etched exceeds 50° C. On the other hand, the oxygen concentration is rapidly increased if the temperature exceeds 50° C. It is considered reasonable to understand that, in this example, the oxidizing reaction takes place vigorously on the SiN surface at temperatures exceeding 50° C., leading to a rapid decrease in the etching rate of SiN.

IR analysis was applied to the SiN surface etched by the method of the present invention, with the results as shown in FIG. 15. As seen from FIG. 15, absorption peaks which are considered to be due to presence of $NH_4^+$ were observed, indicating presence of a deposited (denatured) film on the surface. The deposited (denatured) film can be removed by water wash as described herein later. As a matter of fact, the water used for washing the deposited film was analyzed so as to detect $NH_4^+$, $F^-$ and Si substantially at a ratio of 2:6:1, as shown in Table 1. It is considered reasonable to understand from the ratio noted above that the deposited (denatured) film can be represented by formula $(NH_4)_2SiF_6$. The particular film can be formed on a SiN layer alone and cannot be formed on a Si substrate or a $SiO_2$ layer. The deposited (denatured) film on the SiN layer does not contribute to the etching reaction of Si or $SiO_2$. It should be noted that the etching reaction of SiN is inhibited with increase in the thickness of the deposited (denatured) film on the SiN layer. However, the etching can be continued by removing the deposited (denatured) film by the method described in the following.

shifts in electron peaks of $Si^{2p}$ and $N^{1s}$ on the surface of a SiN layer after etching, indicating formation of a deposited (denatured) film on the SiN layer surface. However, such chemical shifts are not observed after water wash or after heating at 300° C. This clearly indicates that the deposited (denatured) film can be easily removed by washing with water or by heat treatment at 300° C.

A silicon nitride film formed as shown in FIG. 17 was actually etched by the method of the present invention. Specifically, a trench was formed in a silicon substrate 51, followed by forming a buffer oxide film 53 in the entire region except the bottom of the trench. Then, the trench was filled with a poly-Si layer 52. Further, a silicon nitride film 54 was formed on the entire surface, followed by selectively removing by etching the silicon nitride film 54 from the region above the poly-Si layer 52 filling the trench.

Figure 17A:
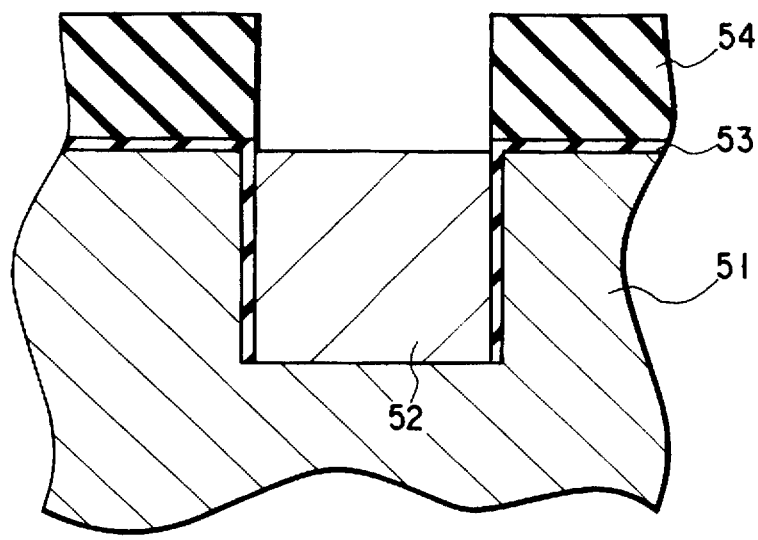
FIG. 17A is a cross sectional view for explaining the etching of a silicon nitride film by the method of the present invention.
Figure 17B:
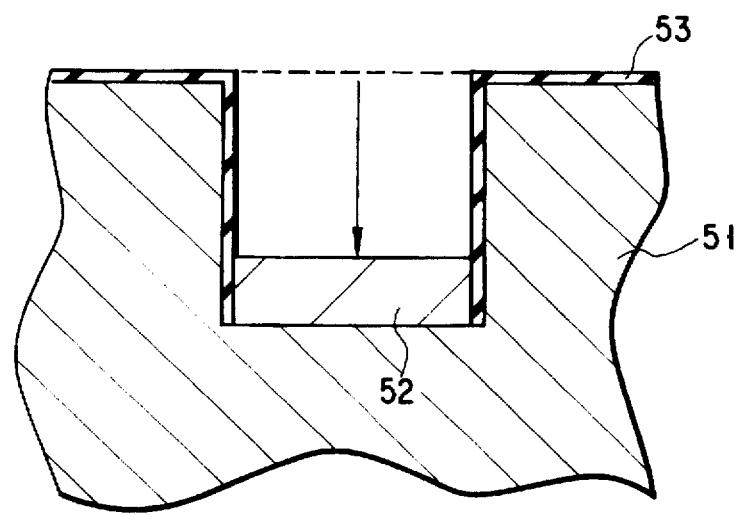
FIG. 17B is a cross sectional view for explaining the etching of a silicon nitride film by the conventional method.

The silicon nitride film 54 was selectively etched by the method of the present invention under the conditions of: power=700 W, pressure=70 Pa, $CF_4/O_2/H_2O$=224/316/60 SCCM, and susceptor temperature=25° C. When 30% of over-etching was applied to the silicon nitride film having a thickness of 200 nm, the etching selectivity of the silicon nitride film relative to the poly-Si, i.e., a ratio of etching rate of silicon nitride to that of silicon, was found to be 9. To be more specific, the surface of the poly-Si layer 52, which was etched in a depth of only 30 nm, was substantially flush with the surface of the silicon substrate 51 after the etching of the silicon nitride film 54, as shown in FIG. 17A. In the conventional method, however, the etching selectivity of silicon nitride relative to silicon is only about 0.3, with the result that the poly-Si layer 52 was etched in such a large depth as 870 nm after the etching of the silicon nitride film 54, as shown in FIG. 17B. Comparison between FIGS. 17A and 17B clearly supports that the method of the present invention permits selectively etching a silicon nitride film relative to silicon.

The etching selectivity of silicon nitride relative to silicon can be improved by suitably selecting the etching conditions. For example, a high etching selectivity of silicon nitride can be achieved under the conditions of: power=700 W, pressure=70 Pa, $CF_4/O_2/H_2O$=140/400/60 SCCM, and susceptor temperature=25° C. When 30% of over-etching was applied to the silicon nitride film 54, the silicon nitride film 54 was completely etched away, though the poly-Si layer 52 was found to be substantially free from etching. The etching selectivity of the silicon nitride film relative to silicon was as high as 30 in this experiment.

Under the etching conditions noted above, the etching reaction is caused to cease to proceed by the deposited (denatured) film described previously when the etching

TABLE 1

| $CF_4/O_2/H_2O$ (SCCM) | | 140/400/50 | 140/400/50 | 270/270/50 | 270/270/50 | 400/140/50 |
|---|---|---|---|---|---|---|
| Pressure (Pa) | | 70 | 70 | 70 | 70 | 70 |
| Power (W) | | 700 | 700 | 700 | 700 | 700 |
| Times (sec) | | 30 | 240 | 30 | 56 | 30 |
| Amount (μg) | $NH_4^+$ | 300 | 1400 | 210 | 270 | 300 |
| on Si | $F^-$ | 670 | 2300 | 600 | 740 | 830 |
| substrate | Si | 200 | 780 | 130 | 160 | 170 |
| Etching amount | | 439 | 1780 | 1128 | 1983 | 1983 |
| Amount (μg) | $NH_4^+$ | 683.371298 | 786.516854 | 186.170213 | 136.157337 | 151.28593 |
| per | $F^-$ | 1526.1959 | 1292.13483 | 531.914894 | 373.171962 | 418.557741 |
| 1000Å | Si | 455.580866 | 438.202247 | 115.248227 | 80.6858296 | 85.7286939 |
| Element ratio $NH_4/F/Si$ | | 2.3/4.9/1 | 2.8/4.3/1 | 2.5/6.8/1 | 2.9/6.8/1 | 2.7/7.2/1 |

Figure 16:
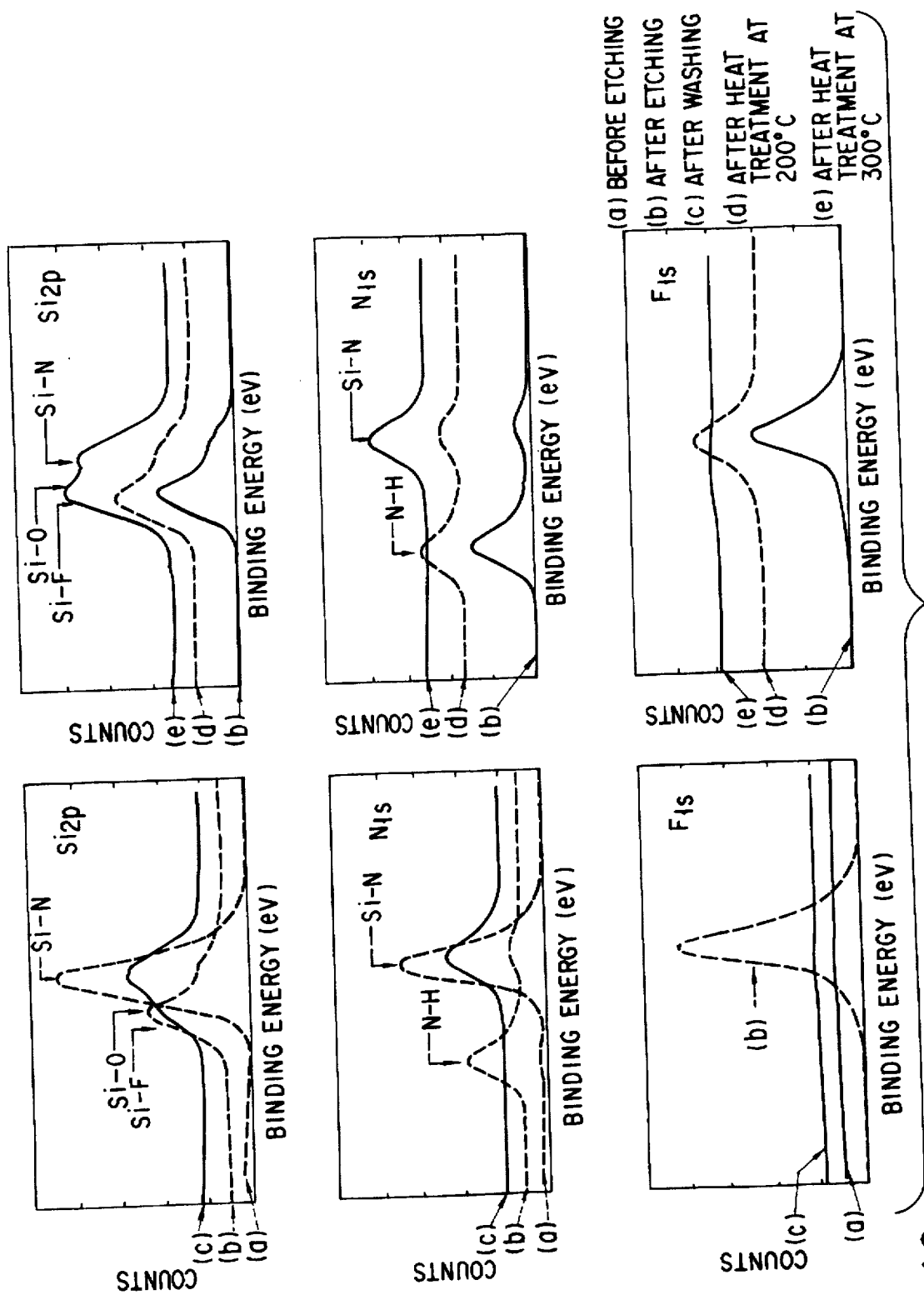
FIG. 16 is a graph showing the XPS analytical result of the silicon nitride surface after the etching.

FIG. 16 shows the results of XPS analysis of SiN before and after etching, after water wash, and after heating at 200° C. and at 300° C. As shown in FIG. 16, there are chemical depth of the silicon nitride film 54 reaches about 100 nm. Thus, the silicon nitride film 54 shown in FIG. 17A, which has a thickness of 200 nm, cannot be removed by a single etching treatment. In this case, it is necessary to remove the deposited (denatured) film formed on the surface by washing with water or by a heat treatment, followed by continuing again the etching of the silicon nitride film.

In this embodiment, a $CF_4$ gas is used as a raw material gas for generating fluorine radicals. Further, F-containing gases such as a $NF_3$ gas, $SF_6$ gas, XeF gas and $F_2$ gas can also be used as a raw material gas for generating fluorine radicals. Still further, H-containing gases such as a $H_2$ gas and $NH_3$ gas can also be used in place of the $H_2O$ gas, which is used as a H-containing gas in this embodiment.

Further, in the above embodiments, the silicon nitride film formed on the silicon substrate or the silicon oxide film is entirely etched. However, the present invention can be applied to a case of etching part of a silicon nitride film. Moreover, it can be applied to a case of etching a silicon nitride film formed on a polycrystalline silicon film, not on a silicon substrate. Furthermore, the present invention can be variously modified within the spirit and scope of the invention.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of etching a silicon nitride film, comprising the steps of:

supplying fluorine radicals, compounds of fluorine and hydrogen, and oxygen radicals to a region near a silicon substrate having a silicon nitride film; and selectively etching, relative to silicon of said silicon substrate, said silicon nitride film formed on said silicon substrate, with said fluorine radicals, fluorine compounds, hydrogen compounds and oxygen radicals, wherein said compounds of fluorine and hydrogen is hydrogen fluoride.

2. The method according to claim 1, wherein said silicon substrate has a temperature of 20° to 60° C.

3. The method according to claim 1, wherein said silicon substrate has a temperature of 45° to 60° C.

4. The method according to claim 1, wherein the pressure of a reaction system is set at 0.5 Torr or less.

5. A method of etching a silicon nitride film, comprising the steps of:

generating fluorine radicals and oxygen radicals by exciting a fluorine-containing gas and an oxygen gas;

supplying said fluorine radicals and oxygen radicals to a region near a silicon substrate having a silicon nitride film, and also supplying a gaseous compound having a hydroxy group to said region near the silicon substrate;

carrying out reactions among said fluorine radicals, oxygen radicals and compound having a hydroxyl group to form fluorine radicals, oxygen radicals, and a compound of fluorine and hydrogen; and selectively etching, relative to silicon of said silicon substrate, said silicon nitride film formed on said silicon substrate with said fluorine radicals, oxygen radicals, and said compound of fluorine and hydrogen, wherein said silicon substrate has a temperature of 20°–60° C.

6. The method according to claim 5, wherein said silicon substrate has a temperature of 45° to 60° C.

7. The method according to claim 5, wherein the pressure of a reaction system is set at 0.5 Torr or less.

8. The method according to claim 5, wherein said compound of fluorine and hydrogen is hydrogen fluoride.

9. The method according to claim 5, wherein said fluorine-containing gas is at least one gas selected from the group consisting of $CF_4$ gas, $SF_6$ gas, $NF_3$ gas, XeF gas, and $F_2$ gas.

10. The method according to claim 5, wherein said compound having a hydroxyl group is at least one compound selected from the group consisting of $H_2O$, $H_2O_2$, methanol, ethanol, ethylene glycol and glycerin.

11. The method according to claim 5, wherein said fluorine-containing gas is a $CF_4$ gas, and a ratio of a flow rate of the $CF_4$ gas to the sum of the flow rates of the $CF_4$ gas and the $O_2$ gas falls within a range of between 0.72 and 0.84.

12. A method of etching a silicon nitride film, comprising the steps of:

generating hydrogen radicals, oxygen radicals, and fluorine radicals by exciting a mixed gas containing a fluorine-containing compound, a hydrogen-containing compound and a gaseous oxygen;

supplying by downflow, said hydrogen radicals, fluorine radicals and oxygen radicals to a region near a substrate having a silicon nitride film; and selectively etching, relative to silicon of said silicon substrate, said silicon nitride film formed on said substrate with hydrogen radicals, fluorine radicals and oxygen radicals, wherein said substrate has a temperature of 20° to 60° C., and said hydrogen-containing compound is at least one compound selected from the group consisting of $H_2O$, $H_2$ and $NH_3$.

13. The method according to claim 12, wherein said silicon substrate has a temperature of 45° to 60° C.

14. The method according to claim 12, wherein the total flow rate of said mixed gas is not higher than 1000 SCCM.

15. The method according to claim 12, wherein said substrate is at least one member selected from the group consisting of a silicon substrate, a silicon film formed on a substrate, and a silicon oxide film formed on a substrate.

16. The method according to claim 12, wherein a material which does not contribute to the etching of said substrate material is formed on said silicon nitride film.

17. The method of claim 12, wherein etching is by chemical dry etching.

18. The method of claim 12, wherein ions which are formed during gereration of said hydrogen radicals, oxygen radicals and fluorine radicals are dactivated before being introduced to said region near said substrate.

* * * * *